(12) United States Patent
Park et al.

(10) Patent No.: US 10,217,839 B2
(45) Date of Patent: Feb. 26, 2019

(54) FIELD EFFECT TRANSISTOR (FET) WITH A GATE HAVING A RECESSED WORK FUNCTION METAL LAYER AND METHOD OF FORMING THE FET

(71) Applicant: GLOBALFOUNDRIES INC., Grand Cayman (KY)

(72) Inventors: Chanro Park, Clifton Park, NY (US); Kisup Chung, Slingerlands, NY (US); Victor Chan, Guilderland, NY (US); Koji Watanabe, Voorheesville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/468,170

(22) Filed: Mar. 24, 2017

(65) Prior Publication Data
US 2018/0277652 A1    Sep. 27, 2018

(51) Int. Cl.
| | |
|---|---|
| *H01L 29/423* | (2006.01) |
| *H01L 29/66* | (2006.01) |
| *H01L 29/49* | (2006.01) |
| *H01L 29/417* | (2006.01) |
| *H01L 21/3105* | (2006.01) |
| *H01L 21/3213* | (2006.01) |
| *H01L 21/768* | (2006.01) |
| *H01L 21/28* | (2006.01) |

(52) U.S. Cl.
CPC .. *H01L 29/66545* (2013.01); *H01L 21/28079* (2013.01); *H01L 21/28088* (2013.01); *H01L 21/31053* (2013.01); *H01L 21/32133* (2013.01); *H01L 21/76897* (2013.01); *H01L 29/41775* (2013.01); *H01L 29/42376* (2013.01); *H01L 29/4958* (2013.01); *H01L 29/4966* (2013.01)

(58) Field of Classification Search
None
See application file for complete search history.

(56) References Cited

U.S. PATENT DOCUMENTS

| | | | |
|---|---|---|---|
| 8,193,641 B2 | 6/2012 | Rachmady et al. | |
| 8,569,135 B2 * | 10/2013 | Guo | .......... H01L 29/4958 257/407 |
| 8,647,972 B1 | 2/2014 | Ando et al. | |
| 8,890,262 B2 | 11/2014 | Kamineni et al. | |
| 9,214,541 B2 | 12/2015 | Ramachandran et al. | |
| 9,246,002 B2 | 1/2016 | Hsiao et al. | |

(Continued)

*Primary Examiner* — Chandra Chaudhari
(74) *Attorney, Agent, or Firm* — Gibb & Riley, LLC; Anthony J. Canale

(57) ABSTRACT

Disclosed is a field effect transistor (FET) with a replacement metal gate (RMG) and a method of forming the FET. The RMG includes a conformal gate dielectric layer and a stack of gate conductor layers on the gate dielectric layer. The stack includes a conformal work function metal (WFM) layer and a conductive fill material (CFM) layer on the WFM layer. Within the stack, the top surface of the CFM layer is above the level of the top of an adjacent vertical portion of the WFM layer. A dielectric gate cap has a center portion and an edge portion. The center portion is above the top surface of the CFM layer and the edge portion is above the top of the adjacent vertical portion of the WFM layer and is further positioned laterally immediately adjacent to an upper portion of an outer sidewall of the CFM layer.

7 Claims, 14 Drawing Sheets

(56) References Cited

U.S. PATENT DOCUMENTS

| | | |
|---|---|---|
| 9,257,529 B2 | 2/2016 | Metz |
| 9,679,847 B2 * | 6/2017 | Zhang ............... H01L 29/42384 |
| 2011/0147831 A1 | 6/2011 | Steigerwald et al. |
| 2014/0145257 A1 | 5/2014 | Kamineni et al. |
| 2016/0204221 A1 | 7/2016 | He et al. |

* cited by examiner

FIELD EFFECT TRANSISTOR (FET) WITH A GATE HAVING A RECESSED WORK FUNCTION METAL LAYER AND METHOD OF FORMING THE FET

BACKGROUND

Field of the Invention

The present invention relates to field effect transistors (FETs) and, more particularly, to a field effect transistor (FET) with a replacement metal gate and a method of forming the FET so as to avoid shorts between the replacement metal gate and adjacent source/drain contacts.

Description of Related Art

Integrated circuit (IC) structures have middle of the line (MOL) contacts that connect field effect transistors (FETs) to back end of the line (BEOL) metal levels. The MOL contacts include at least one gate contact (also referred to herein as a CB contact) and source/drain contacts (also referred to herein as CA contacts). Each gate contact extends essentially vertically through an interlayer dielectric (ILD) layer from a metal wire or via in the first BEOL metal level (also referred to herein as the $M_0$ level) to the gate of the FET. Each source/drain contact extends essentially vertically through the ILD layer from a metal wire or via in the first BEOL metal level to a metal plug (also referred to herein as a TS contact), which is above and immediately adjacent to a source/drain region of the FET and which is positioned laterally adjacent to the gate and separated therefrom by a gate sidewall spacer. Conventional techniques for forming the FETs and the MOL contacts described above inherently include the risk of shorts occurring between the source/drain contacts, which land on the metal plugs above the source/drain regions, and the gate.

SUMMARY

In view of the foregoing, disclosed herein are embodiments of a field effect transistor (FET) with a replacement metal gate configured so as to minimize the occurrence of shorts between the conductive materials of the gate and any adjacent source/drain contacts. Also disclosed herein are embodiments of a method of forming the above-described FET.

More particularly, disclosed herein are embodiments of a field effect transistor (FET). The FET can include a semiconductor body with source/drain regions and a channel region positioned laterally between the source/drain regions. The FET can also include a replacement metal gate adjacent to the semiconductor body at the channel region. The replacement metal gate can include a conformal gate dielectric layer immediately adjacent to the semiconductor body at the channel region and a stack of gate conductor layers on the conformal gate dielectric layer. The stack of gate conductor layers can include a conformal work function metal layer on the conformal gate dielectric layer and a conductive fill material layer on the conformal work function metal layer. The conductive fill material layer can have a top surface and an outer sidewall. A vertical portion of the conformal work function metal layer can be positioned laterally immediately adjacent to a lower portion of the outer sidewall (but not the upper portion). Thus, within the stack, the top surface of the conductive fill material layer is above the level of the top of the adjacent vertical portion of the conformal work function metal layer. The FET can further include a dielectric gate cap. The dielectric gate cap can have a center portion and an edge portion laterally surrounding the center portion. The center portion can be above and immediately adjacent to the top surface of the conductive fill material layer. The edge portion can be above and immediately adjacent to the top of the adjacent vertical portion of the conformal work function metal layer and further positioned laterally immediately adjacent to the upper portion of the outer sidewall of the conductive fill material layer.

Also disclosed herein are embodiments of a method of forming the above-described FET. Generally, the embodiments of the method can include forming a replacement metal gate in a gate opening that extends essentially vertically through an interlayer dielectric layer and that exposes a semiconductor body at a channel region. This process of forming the replacement metal gate can include depositing a conformal dielectric layer to line the gate opening, depositing a conformal metal layer on the conformal dielectric layer, and depositing a conductive fill material layer to fill any remaining space in the gate opening. After the conductive fill material layer is deposited, a polishing process can be performed in order to remove the conformal dielectric layer, the conformal metal layer and the conductive fill material layer from above the interlayer dielectric layer and to ensure that the top of a vertical portion of the conformal metal layer that is positioned laterally immediately adjacent to an outer sidewall of the conductive fill material layer is approximately level with the top surface of the conductive fill material layer. Next, at least one etch process can be performed in order to etch back the top surface of the conductive fill material layer to a first depth and to further etch back the top of the vertical portion of the conformal metal layer to a second depth that is greater than the first depth, thereby exposing an upper portion of the outer sidewall of the conductive fill material layer. Subsequently, a dielectric gate cap can be formed on the gate. Specifically, the dielectric gate cap can be formed so as to have a center portion and an edge portion, wherein the center portion is above and immediately adjacent to the top surface of the conductive fill material layer and wherein the edge portion laterally surrounds the center portion, is above and immediately adjacent to the top of the adjacent vertical portion of the conformal metal layer, and is further positioned laterally immediately adjacent to the exposed upper portion of the outer sidewall of the conductive fill material layer.

One particular embodiment of the method similarly includes forming a replacement metal gate in a gate opening that extends essentially vertically through an interlayer dielectric layer and that exposes a semiconductor body at a channel region. This process of forming the replacement metal gate can include depositing a conformal dielectric layer to line the gate opening, depositing a conformal metal layer on the conformal dielectric layer, and depositing a conductive fill material layer to fill any remaining space in the gate opening. After the conductive fill material layer is deposited, a polishing process can be performed in order to remove the conformal dielectric layer, the conformal metal layer and the conductive fill material layer from above the interlayer dielectric layer and to ensure that the top of a vertical portion of the conformal metal layer that is positioned laterally immediately adjacent to an outer sidewall of the conductive fill material layer is approximately level with the top surface of the conductive fill material layer. In this particular embodiment, a single etch process is performed in order to essentially simultaneously etch back the top surface of the conductive fill material layer to a first depth and the top of the vertical portion of the conformal metal layer to a second depth that is greater than the first depth, thereby exposing an upper portion of the outer sidewall of the conductive fill material layer. Subsequently, a dielectric gate cap can be formed on the gate. Specifically, the dielectric gate cap can be formed so as to have a center portion and an edge portion, wherein the center portion is above and immediately adjacent to the top surface of the conductive fill material layer and wherein the edge portion laterally surrounds the center portion, is above and immediately adjacent to the top of the adjacent vertical portion of the conformal metal layer and is further positioned laterally immediately adjacent to the exposed upper portion of the outer sidewall of the conductive fill material layer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
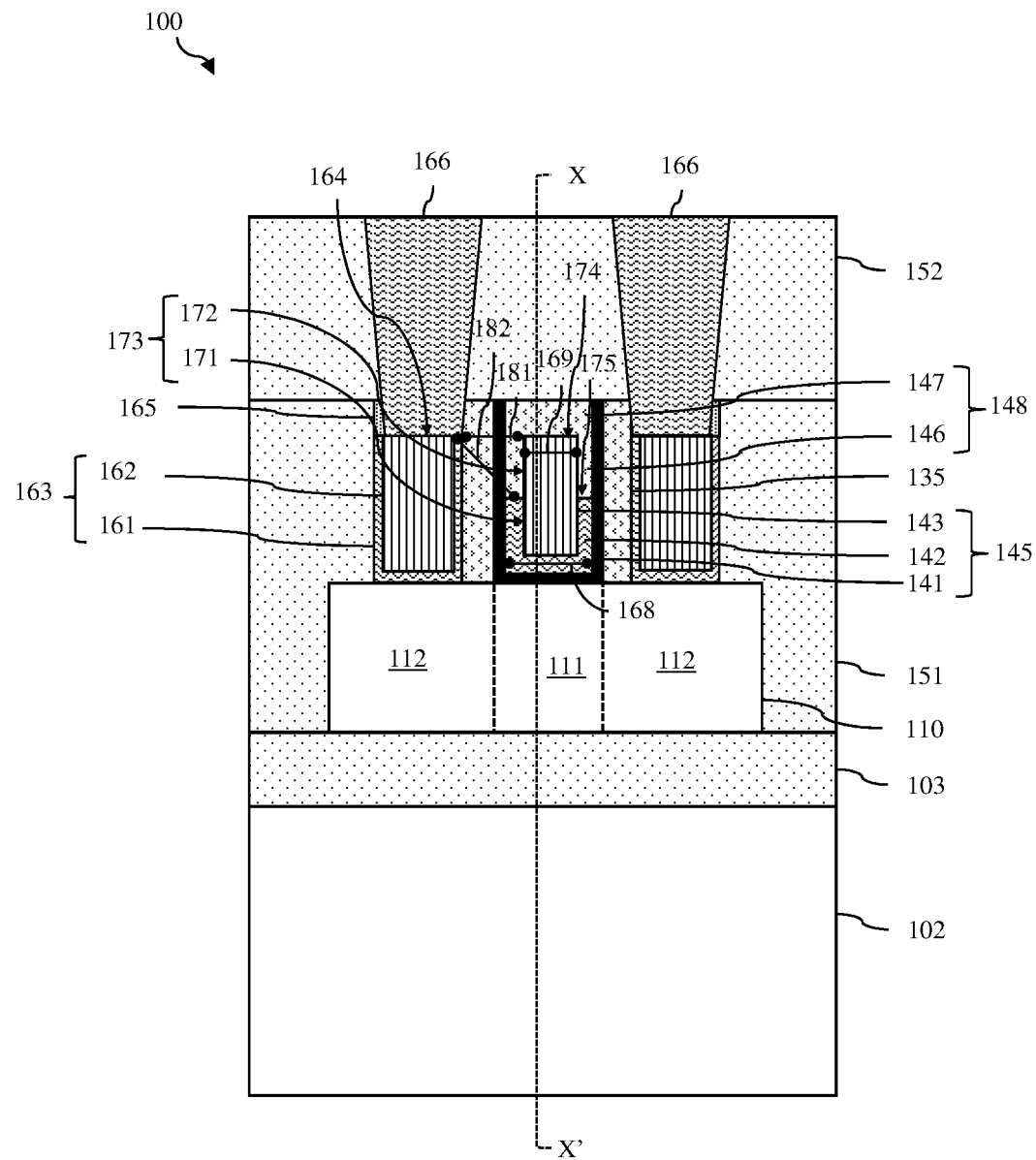
FIGS. 1A and 1B are different cross section diagrams illustrating a field effect transistor (FET) having a replacement metal gate with a recessed work function metal layer.

As mentioned above, integrated circuit (IC) structures have middle of the line (MOL) contacts that connect field effect transistors (FETs) to back end of the line (BEOL) metal levels. The MOL contacts include at least one gate contact (also referred to herein as a CB contact) and source/ drain contacts (also referred to herein as CA contacts). Each gate contact extends essentially vertically through an interlayer dielectric (ILD) layer from a metal wire or via in the first BEOL metal level (also referred to herein as the M0 level) to the gate of the FET. Each source/drain contact extends essentially vertically through the ILD layer from a metal wire or via in the first BEOL metal level to a metal plug (also referred to herein as a TS contact), which is above and immediately adjacent to a source/drain region of the FET and which is positioned laterally adjacent to the gate and separated therefrom by a gate sidewall spacer. Conventional techniques for forming the FETs and the MOL contacts described above inherently include the risk of shorts occurring between the source/drain contacts, which land on the metal plugs above the source/drain regions, and the gate.

In view of the foregoing, disclosed herein are embodiments of a field effect transistor (FET) with a replacement metal gate configured so as to minimize the occurrence of shorts between the conductive materials of the gate and any adjacent source/drain contacts. Specifically, the replacement metal gate can include a conformal gate dielectric layer and a stack of gate conductor layers on the conformal gate dielectric layer. The stack of gate conductor layers can include a conformal work function metal layer and a conductive fill material layer on the conformal work function metal layer. Within the stack, the top surface of the conductive fill material layer is above the level of the top of an adjacent vertical portion of the conformal work function metal layer. A dielectric gate cap can have a center portion and an edge portion. The center portion can be above the top surface of the conductive fill material layer. The edge portion can laterally surround the center portion, can be above the top of the adjacent vertical portion of the conformal work function metal layer, and can further be positioned laterally immediately adjacent to an upper portion of an outer sidewall of the conductive fill material layer. Thus, the stack of gate conductor layers within the replacement metal gate will have a lower section with a first width, as measured near the semiconductor body, and an upper section with a second width, as measured near the dielectric gate cap, and the second width will be narrower than the first width. By narrowing the width of the stack near the dielectric gate cap and by protecting the upper portion of the outer sidewall as well as the top surface of the conductive fill material layer with that dielectric gate cap, the likelihood of shorts occurring between the conductive materials of the gate and any adjacent source/drain contacts is effectively reduced. Also disclosed herein are embodiments of a method of forming the above-described FET.

Figure 1B:
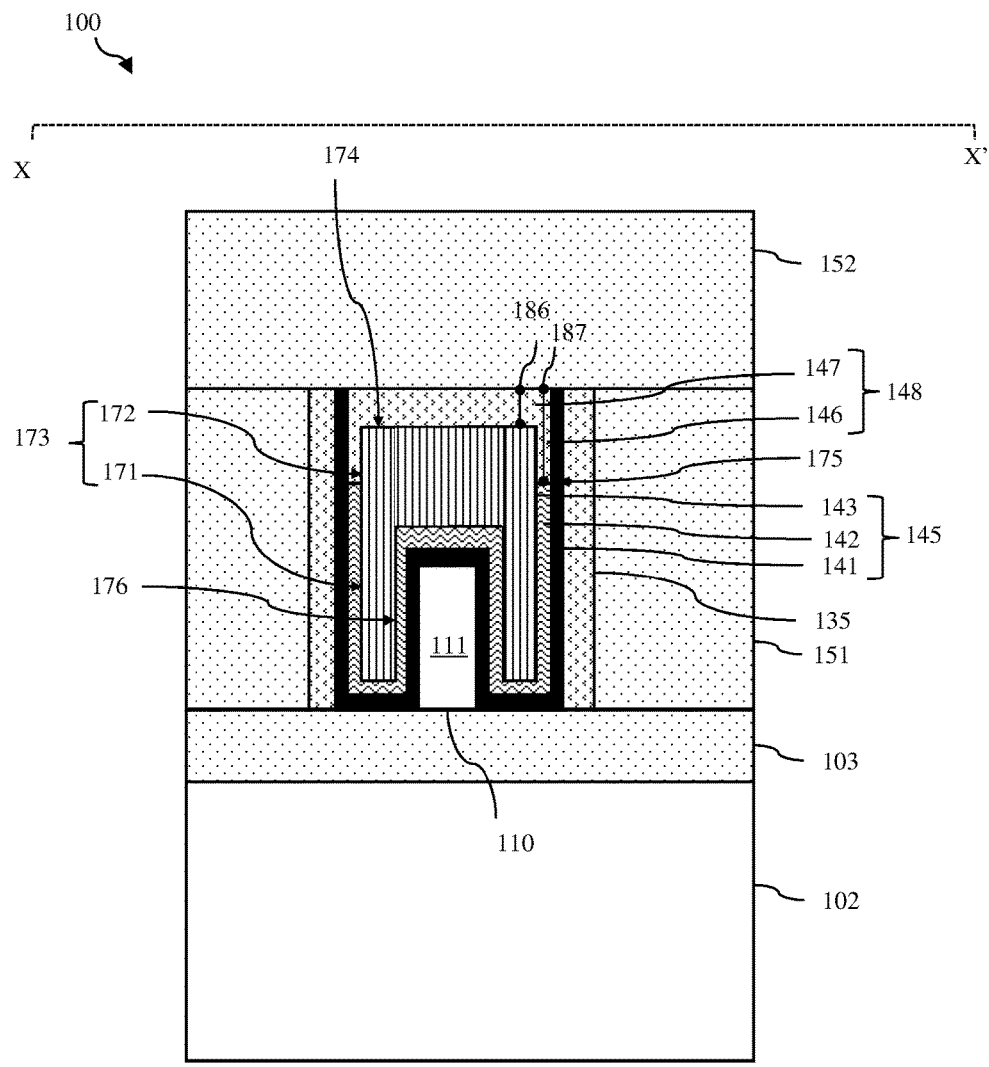

More particularly, referring to FIGS. 1A-1B, disclosed herein are embodiments of a field effect transistor (FET) 100.

The FET 100 can be formed on a semiconductor-on-insulator wafer (e.g., a silicon-on-insulator (SOI) wafer or any other suitable semiconductor-on-insulator wafer), which includes a substrate 102 (e.g., a silicon substrate or any other suitable substrate including, but not limited to, a silica glass substrate or a silicon carbide (SiC) substrate), an insulator layer 103 (e.g., a buried oxide (BOX) layer or other suitable insulator layer) on the substrate 102 and a semiconductor layer (e.g., a silicon layer or any other suitable monocrystalline semiconductor layer) on the insulator layer 103. Alternatively, the FET 100 can be formed on a bulk semiconductor wafer (e.g., a bulk silicon wafer). For purposes of illustration, the FET 100 is described below and illustrated in FIGS. 1A-1B as being formed on a semiconductor-on-insulator wafer.

The FET 100 can include a semiconductor body 110. For a planar FET, the semiconductor body 110 can be an essentially rectangular-shaped semiconductor body defined in a semiconductor layer (or an upper portion of a bulk semiconductor substrate) by trench isolation regions. For a non-planar FET, such as a fin-type FET (FINFET) or tri-gate FET, the semiconductor body 110 can be a tall, relatively thin, elongated, essentially rectangular-shaped semiconductor body (also referred to as a semiconductor fin). For purposes of illustration, the FET 100 is described below and illustrated in FIGS. 1A-1B as a FINFET. However, it should be understood that the figures are not intended to be limiting and that the FET 100 could, alternatively, be a planar FET.

In any case, the semiconductor body 110 can include source/drain regions 112 and a channel region positioned laterally between the source/drain regions 112. The channel region 111 can have a first type conductivity at a relatively low conductivity level. The source/drain regions 112 can have a second type conductivity, which is different from the first type conductivity, at a relatively high conductivity level. Those skilled in the art will recognize that the different conductivity types of the channel region and the source/drain regions will vary depending upon whether the FET 100 is an N-type FET (NFET) or a P-type FET (PFET). For example, for an NFET, the channel region 111 can have a P-type conductivity and the source/drain regions 112 can have an N-type conductivity; whereas, for a PFET, the channel region 111 can have an N-type conductivity and the source/drain regions 112 can have a P-type conductivity. Optionally, the semiconductor body 110 may include any one or more of the following features (not shown): epitaxial source/drain regions within trenches in the source/drain regions 112 and/or on the source/drain regions 112, source/drain extension regions between the source/drain regions 112 and the channel region 111, halo regions, drain drift regions etc. Such features are well known in the art and, thus, the details thereof are omitted from this specification in order to allow the reader to focus on the salient aspects of the disclosed embodiments.

The FET 100 can further include: a replacement metal gate 145 immediately adjacent to the semiconductor body 110 at the channel region 111; a dielectric gate cap 148 above and immediately adjacent to the replacement metal gate 145; a gate sidewall spacer 135 laterally surrounding the replacement metal gate 145; and an interlayer dielectric (ILD) layer 151 covering the source/drain regions 112 and positioned laterally to the gate sidewall spacer 135.

The replacement metal gate 145 can include a conformal gate dielectric layer 141. In the case of a FINFET formed on a semiconductor-on-insulator wafer, the conformal gate dielectric layer 141 can have vertical and horizontal portions that are essentially perpendicular to the vertical portions, as illustrated. The vertical portions can be immediately adjacent to the opposing sides of the semiconductor body 110 at the channel region 111 and also immediately adjacent to the gate sidewall spacer 135. The horizontal portions can be above the top surface of the semiconductor body 110 at the channel region 111 and also on the insulator layer 103 between the semiconductor body 110 and the gate sidewall spacer 135. The conformal gate dielectric layer 141 can be a silicon dioxide gate dielectric layer. Alternatively and preferably, the conformal gate dielectric layer 141 can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.).

The replacement metal gate 145 can further include a stack of gate conductor layers on the conformal gate dielectric layer 141. The stack of gate conductor layers can include, for example, at least one conformal metal layer 142 and, particularly, at least one conformal work function metal layer, and a conductive fill material layer 143.

The conformal work function metal layer 142 can cover and be immediately adjacent to the conformal gate dielectric layer 141. In the case of a FINFET, the conformal work function metal layer(s) 142 can have vertical portions and horizontal portions that are essentially perpendicular to the vertical portions. The vertical portions can be positioned laterally immediately adjacent to the vertical portions of the conformal gate dielectric layer 141 opposite the semiconductor body 110 and the gate sidewall spacer 135, respectively. The horizontal portions can be above and immediately adjacent to the horizontal portions of the conformal gate dielectric layer 141 opposite the top surface of the semiconductor body 110 and the insulator layer 103, respectively. The metal material or metal alloy material of the conformal work function metal layer 142 can be preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

The conductive fill material layer 143 can be on and immediately adjacent to the conformal work function metal layer 142. The conductive fill material layer 143 can have an outer sidewall 173 facing the gate sidewall spacer 135. The outer sidewall 173 can have a lower portion 171, which is immediately adjacent to a vertical portion of the conformal work function metal layer 142, and an upper portion 172 above the lower portion 171. The conductive fill material layer 143 can further have a top surface 174, which is above the level of the top 175 of the immediately adjacent vertical portion of the conformal work function metal layer 142. Furthermore, in the case of a FINFET, the conductive fill material layer 143 can have an inner vertical surface facing the semiconductor body 110 and physically separated therefrom by the gate dielectric layer 141 and the conformal work function metal layer 142. The conductive fill material layer 143 can be a layer of metal or a metal alloy. For example, the conductive fill material layer 143 can be a layer of tungsten, a tungsten alloy (e.g., tungsten silicide or titanium tungsten), cobalt, aluminum or any other suitable metal or metal alloy fill material. Alternatively, the conductive fill material layer 143 can include a layer of doped polysilicon.

The dielectric gate cap 148 can have a center portion 147 and an edge portion 146. The center portion 147 can be above, essentially parallel to, and immediately adjacent to the top surface 174 of the conductive fill material layer 143. The edge portion 146 can laterally surround and be oriented essentially perpendicular to the center portion 147, can be above and immediately adjacent to the top 175 of the adjacent vertical portion of the conformal work function metal layer 142 and can further be positioned laterally immediately adjacent to (i.e., directly beside) and essentially parallel to the upper portion 172 of the outer sidewall 173 of the conductive fill material layer 143. Thus, the lower portion 171 of the outer sidewall 173 of the conductive fill material layer 143 is physically separated from the gate sidewall spacer 135 by portions of the conformal work function metal layer 142 and the conformal gate dielectric layer 142. The upper portion 172 of the outer sidewall 173 of the conductive fill material layer 143 is physically separated from the gate sidewall spacer 135 by portions of the dielectric gate cap 148 and possibly the conformal gate dielectric layer 141. It should be noted that the center portion 147 of the dielectric gate cap 148 can have a first thickness 186 (as measured from the top of the dielectric gate cap 148 to the top surface 174 of the conductive fill material layer 143), the edge portion 146 can have a second thickness 187 (as measured from the top of the dielectric gate cap 148 to the top 175 of the adjacent vertical portion of the conformal metal layer 142) and the second thickness of the edge portion 146 can be at least 1.25 times greater than the first thickness of the center portion 147 (e.g., 1.5 times greater, 2 times greater, etc.) (see FIG. 1B). The dielectric gate cap 148 can be made, for example, of silicon nitride, silicon carbon nitride, silicon boron carbon nitride, silicon oxycarbide, or some other suitable gate cap material.

It should be noted that the top of the gate dielectric layer 141 can be essentially level with the top surface of the ILD layer 151, as illustrated. In this case, the gate dielectric layer 141 will laterally surround and be immediately adjacent to the dielectric gate cap 148. Alternatively, during processing as discussed in greater detail below, the top of the gate dielectric layer 141 may be etched back so that at least a portion of the dielectric gate cap 148 is laterally surrounded by an immediately adjacent to the gate sidewall spacer 135.

The gate sidewall spacer 135 can be made of the same dielectric material as the dielectric gate cap 148 or, alternatively, a different dielectric material. For example, the gate sidewall spacer 135 can be made of silicon nitride, silicon carbon nitride, silicon boron carbon nitride, silicon oxycarbide, or some other suitable gate sidewall spacer material.

The FET 100 can further include metal plugs 163, which extend essentially vertically through the ILD layer 151 to the source/drain region 112 (or, more specifically, to epitaxial source/drain regions, if present), respectively, such that the metal plugs are essentially parallel to the replacement metal gate. The metal plugs 163 can further be capped with dielectric plug caps 165. These metal plugs 163 can include, for example, one or more conformal layers 161 such as a conformal adhesive layer (e.g., a titanium adhesive layer or other suitable adhesive layer) and/or a conformal barrier layer (e.g., titanium nitride barrier layer or other suitable barrier layer), which line plug openings in the ILD layer 151, and a conductor 162 and, particularly, a metal or metal alloy (e.g., a tungsten, cobalt, aluminum or any other suitable metal plug material), which fill the remaining spaces within the openings. The dielectric plug caps 165 can be made of the same dielectric material as the dielectric gate cap 148. Alternatively, the dielectric plug caps 165 can be made of a different material. The top surfaces 164 of the metal plugs 163 can specifically be above the level of the top 175 of the conformal work function metal layer 142. For example, the top surfaces 164 of the metal plugs 163 can be approximately co-planar with the top surface 174 of the conductive fill material layer 143.

In the FET 100, the top surfaces of the ILD layer 151, the dielectric gate cap 148, the gate sidewall spacer 135 and the dielectric plug caps 165 are essentially co-planar. Furthermore, an additional ILD layer 152 can be above and immediately adjacent to the ILD layer 151. The additional ILD layer 152 can further extend over the dielectric plug caps 165, the gate sidewall spacer 135 and the dielectric gate cap 148.

The FET 100 can further include source/drain contacts 166. The source/drain contacts 166 can extend essentially vertically through the additional ILD layer 152 and the dielectric plug caps 165 to the top surfaces 164 of the metal plugs 163, respectively. Thus, each source/drain contact 165 has a bottom surface that is above and immediately adjacent to the top surface 164 of a metal plug 163 and this bottom surface and, more particularly, the interface between the bottom surface of the source/drain contact 166 and the top surface 164 of the metal plug 163 will be above the level of the top 175 of the vertical portion of the conformal work function metal layer 142. For example, the interface between the bottom surface of the source/drain contact 166 and the top surface 164 of the metal plug 163 can be approximately level with the interface between the dielectric gate cap 148 and the top surface 174 of the conductive fill material layer 143. Thus, as illustrated in FIG. 1A, each source/drain contact 155 will be physically separated from the conductive fill material layer 143 of the gate 145 by at least a first distance 181 and from the conformal metal layer 142 by at least a second distance 182 that is equal to or greater than the first distance 181.

In the above-described FET structure, the conformal work function metal layer 142 is recessed relative to the conductive fill material layer 143. As a result, the stack of gate conductor layers within the replacement metal gate 145 will have a lower section with a first width 168, as measured near the semiconductor body 110, an upper section with a second width 169 of the stack, as measured near the dielectric gate cap 148, and the second width 169 will be narrower than the first width 168. By narrowing the width of the stack near the dielectric gate cap 148 and by protecting the upper portion 172 of the outer sidewall 173 as well as the top surface 174 of the conductive fill material layer 143 with that dielectric gate cap 148, the likelihood of shorts occurring between the conductive materials of the replacement metal gate 145 and any adjacent source/drain contacts 166 is effectively reduced.

Figure 2:
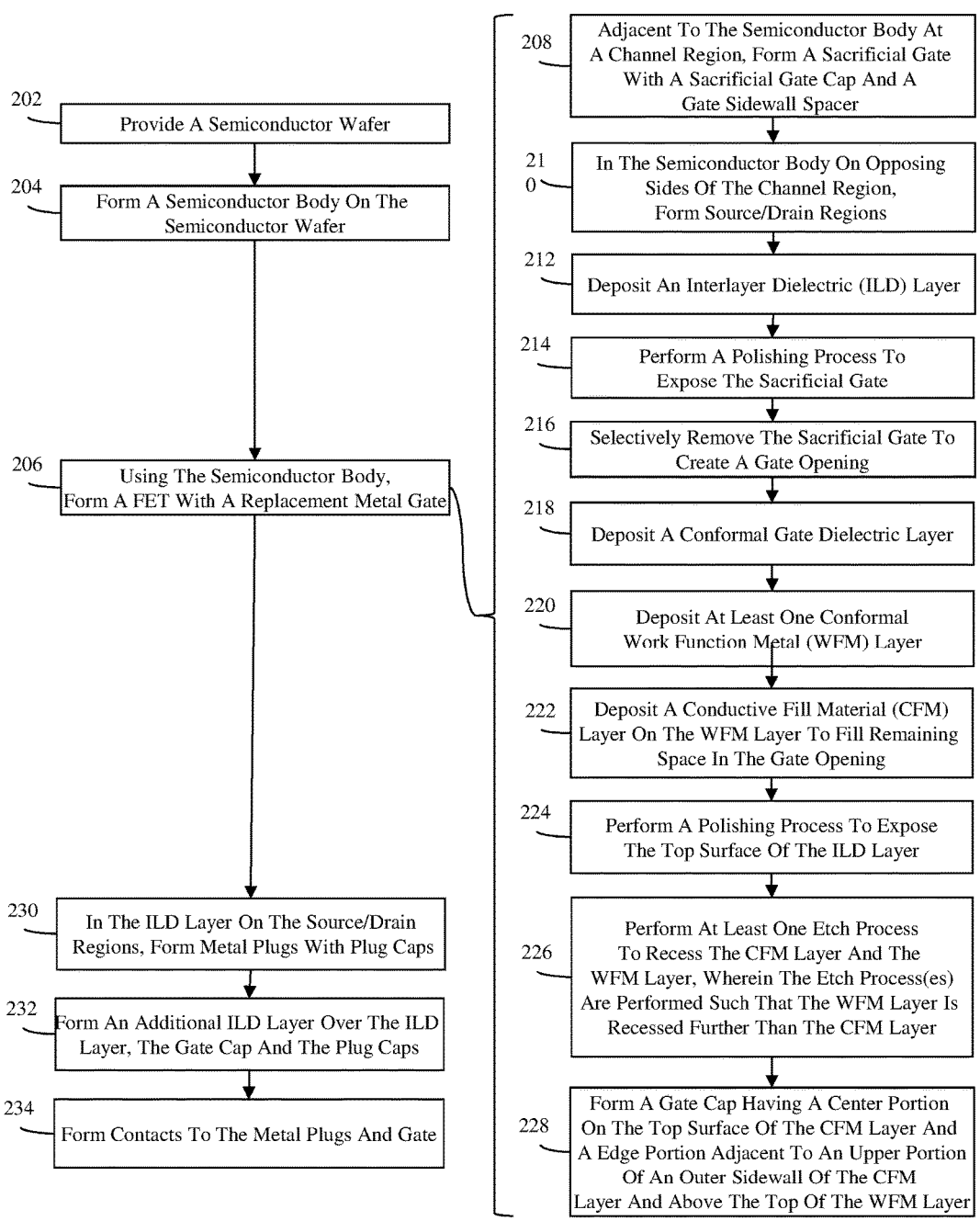
FIG. 2 is a flow diagram illustrating embodiments of a method of forming the FET of FIGS. 1A-1B.

Referring to the flow diagram of FIG. 2, also disclosed herein are embodiments of a method of forming the above-described FET 100.

Figure 3:
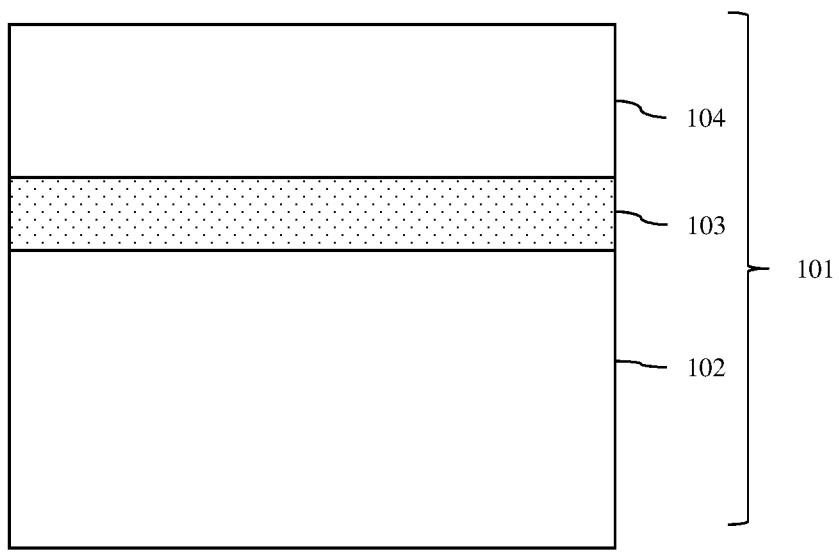
FIG. 3 is a cross section diagram illustrating a partially completed FET formed according to the flow diagram of FIG. 2.

The method can include providing a semiconductor wafer 101 (202). The semiconductor wafer 101 can be, for example, a semiconductor-on-insulator wafer (e.g., a silicon-on-insulator (SOI) wafer or any other suitable semiconductor-on-insulator wafer), as illustrated in FIG. 3. Such a semiconductor-on-insulator wafer can include a substrate 102 (e.g., a silicon substrate or any other suitable substrate including, but not limited to, a silica glass substrate or a silicon carbide (SiC) substrate), an insulator layer 103 (e.g., a buried oxide (BOX) layer or other suitable insulator layer) on the substrate 102 and a semiconductor layer 104 (e.g., a silicon layer or any other suitable monocrystalline semiconductor layer) on the insulator layer 103. Alternatively, the semiconductor wafer 101 can be a bulk semiconductor wafer (e.g., a bulk silicon wafer) (not shown).

Figure 4:
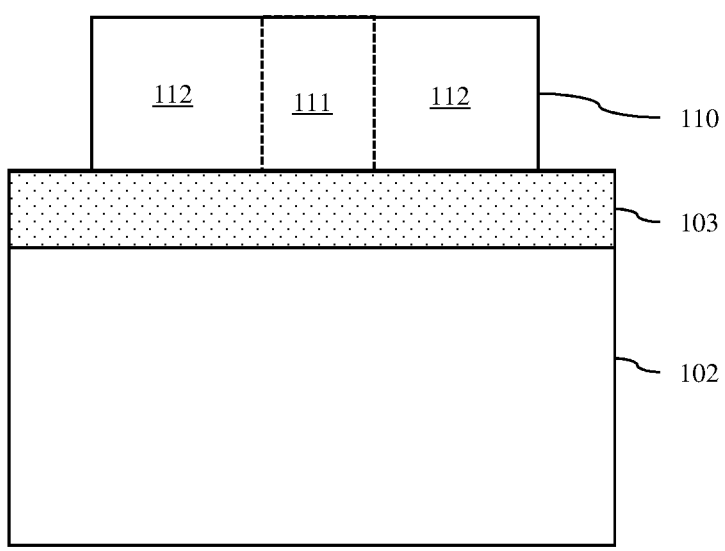
FIG. 4 is a cross section diagram illustrating a partially completed FET formed according to the flow diagram of FIG. 2.

The method can further include forming a semiconductor body 110 on the semiconductor wafer 101 (e.g., from the semiconductor layer of a semiconductor-on-insulator wafer or from an upper portion of a bulk semiconductor wafer) (204, see FIG. 4). For example, for a planar FET, conventional shallow trench isolation (STI) formation techniques can be used to define an essentially rectangular-shaped semiconductor body on the semiconductor wafer. For a non-planar FET, such as a fin-type FET (FINFET) or tri-gate FET, conventional lithographic patterning techniques or sidewall image transfer (SIT) techniques can be used to define a tall, relatively thin, elongated, essentially rectangular-shaped semiconductor body on the semiconductor wafer. Techniques for defining semiconductor bodies for planar and non-planar FETs are well known in the art and, thus, the details have been omitted from this specification in order to allow the reader to focus on the salient aspects of the disclosed method. For purposes of illustration, the method is described below and illustrated in the figures with respect to forming a FINFET. However, it should be understood that the figures are not intended to be limiting and that this method could, alternatively, be used to form a planar FET. In any case, the semiconductor body 110 can have areas designated for source/drain regions 112 and a channel region 111 positioned laterally between the source/drain regions. It should be noted that the semiconductor body 110 can be doped with a first dopant, either before or after formation, so that the channel region 111 will have a first type conductivity at a relatively low conductivity level. Alternatively, the channel region 111 can remain undoped.

Next, a FET 100 can be formed using the semiconductor body 110 (206). The FET 100 can specifically be formed with a replacement metal gate configured so as to reduce the likelihood of gate-to-source/drain contact shorts.

Figure 5:
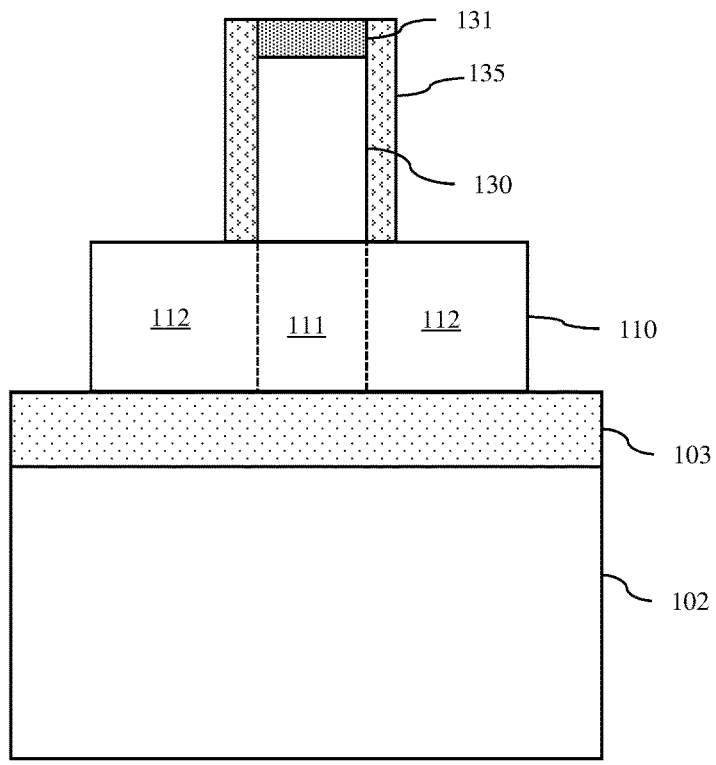
FIG. 5 is a cross section diagram illustrating a partially completed FET formed according to the flow diagram of FIG. 2.

Specifically, to form the FET 100, a sacrificial gate 130 with a sacrificial gate cap 131 and a gate sidewall spacer 135 can be formed adjacent to the semiconductor body 110 at the channel region 111 (208, see FIG. 5).

For example, one or more sacrificial gate layers can be deposited. The sacrificial gate layer(s) can include, for example, an optional conformal sacrificial gate dielectric layer (e.g., a conformal oxide layer) on the semiconductor body 110 and a blanket sacrificial layer (e.g., a blanket polysilicon layer, a blanket sacrificial amorphous silicon layer or a blanket layer of some other suitable sacrificial material) on the conformal sacrificial gate dielectric layer. A sacrificial gate cap layer (e.g., a silicon nitride layer) can be formed on the top surface of the blanket sacrificial layer. The sacrificial layers can then be lithographically patterned and etched to form the sacrificial gate 130 (also referred to herein as a dummy gate) with the sacrificial gate cap 131. It should be understood that, in the case of a FINFET, the sacrificial gate will be adjacent to the top surface and opposing sidewalls of the semiconductor body 110 at the channel region 111.

The gate sidewall spacer 135 can then be formed on the sidewalls of the sacrificial gate 130 such it laterally surrounds and is immediately adjacent to the sacrificial gate 130. The gate sidewall spacer 135 can be formed, for example, using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacer 135 can be made of silicon nitride, silicon carbon nitride, silicon boron carbon nitride, silicon oxycarbide, or any other suitable gate sidewall spacer material that is different from the material used for the sacrificial gate 130.

Source/drain regions 112 can be formed in the semiconductor body 110 on opposing sides of the channel region 111 (210). For example, a dopant implantation process can subsequently be performed to dope the source/drain regions 112 with a second dopant so that the source/drain regions 112 have a second-type conductivity at a relatively high conductivity level. Additionally or alternatively, epitaxial semiconductor material (e.g., epitaxial silicon or any other suitable epitaxial semiconductor material) can be deposited on exposed portions of the semiconductor body 110 (i.e., on the source/drain regions 112) to form raised source/drain regions (not shown). The epitaxial semiconductor material can be in-situ doped or subsequently implanted with the second dopant so that the source/drain regions 112 and the raised source/drain regions have the second-type conductivity at the relatively high conductivity level. Optionally, before depositing the epitaxial semiconductor material, as described above, the source/drain regions 112 can be recessed (not shown), thereby ensuring that the source/drain regions 112 and the epitaxial source/drain regions will be properly doped.

Figure 6:
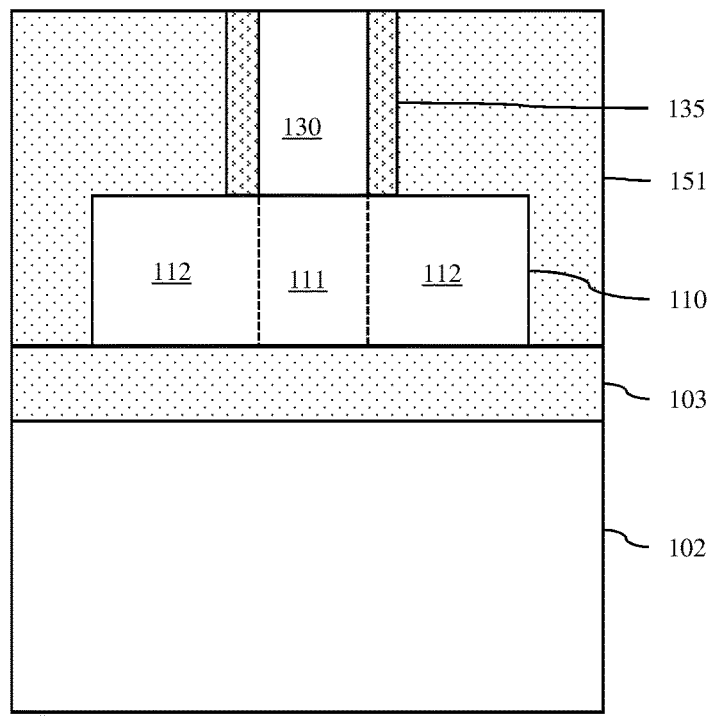
FIG. 6 is a cross section diagram illustrating a partially completed FET formed according to the flow diagram of FIG. 2.

Next, an interlayer dielectric (ILD) layer 151 can be formed over the partially completed structure and then polished (212-214, see FIG. 6). Specifically, a blanket ILD layer 151 can be deposited so as to cover the sacrificial gate cap 131, the gate sidewall spacer 135 and the source/drain regions 112 (or raised source/drain region, if present). The blanket ILD layer 151 can be, for example, a silicon dioxide layer or other suitable blanket layer of ILD material (e.g., borophosphosilicate glass (BPSG), tetraethyl orthosilicate (TEOS), fluorinated tetraethyl orthosilicate (FTEOS), etc.). A chemical mechanical polishing (CMP) process can then be performed in order to remove the sacrificial gate cap and expose the top surfaces of the sacrificial gate 130 and the gate sidewall spacer 135.

Figure 7:
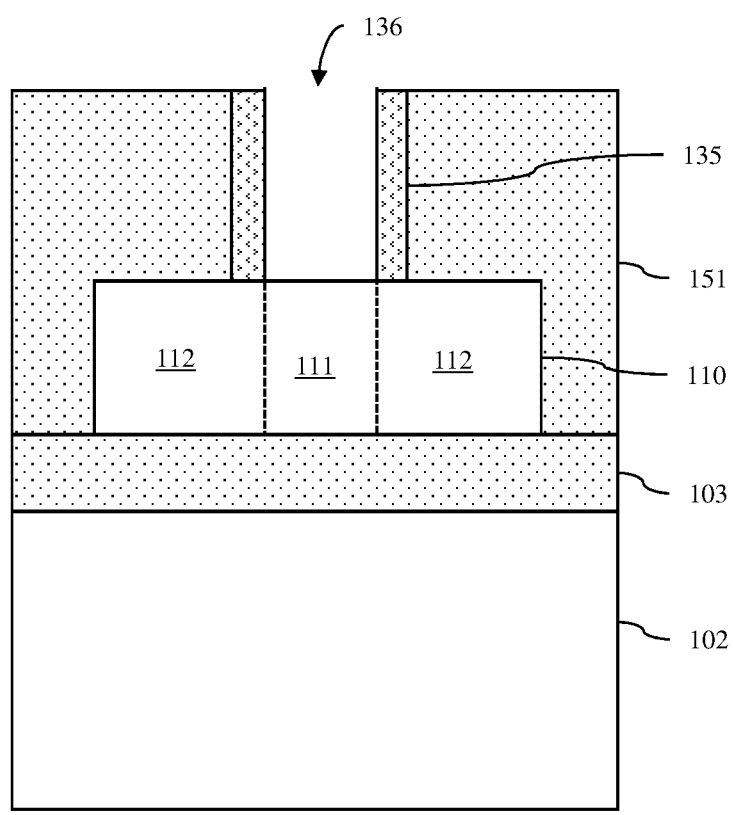
FIG. 7 is a cross section diagram illustrating a partially completed FET formed according to the flow diagram of FIG. 2.
Figure 8A:
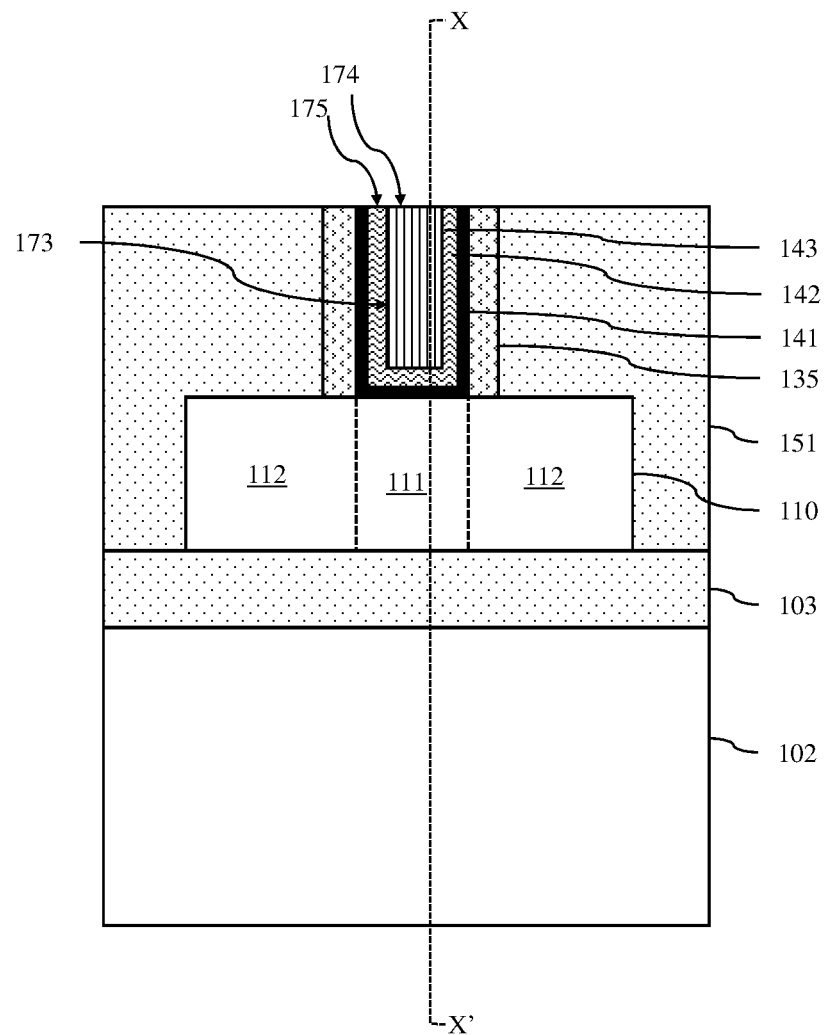
FIGS. 8A and 8B are different cross section diagrams illustrating a partially completed FET formed according to the flow diagram of FIG. 2.
Figure 8B:
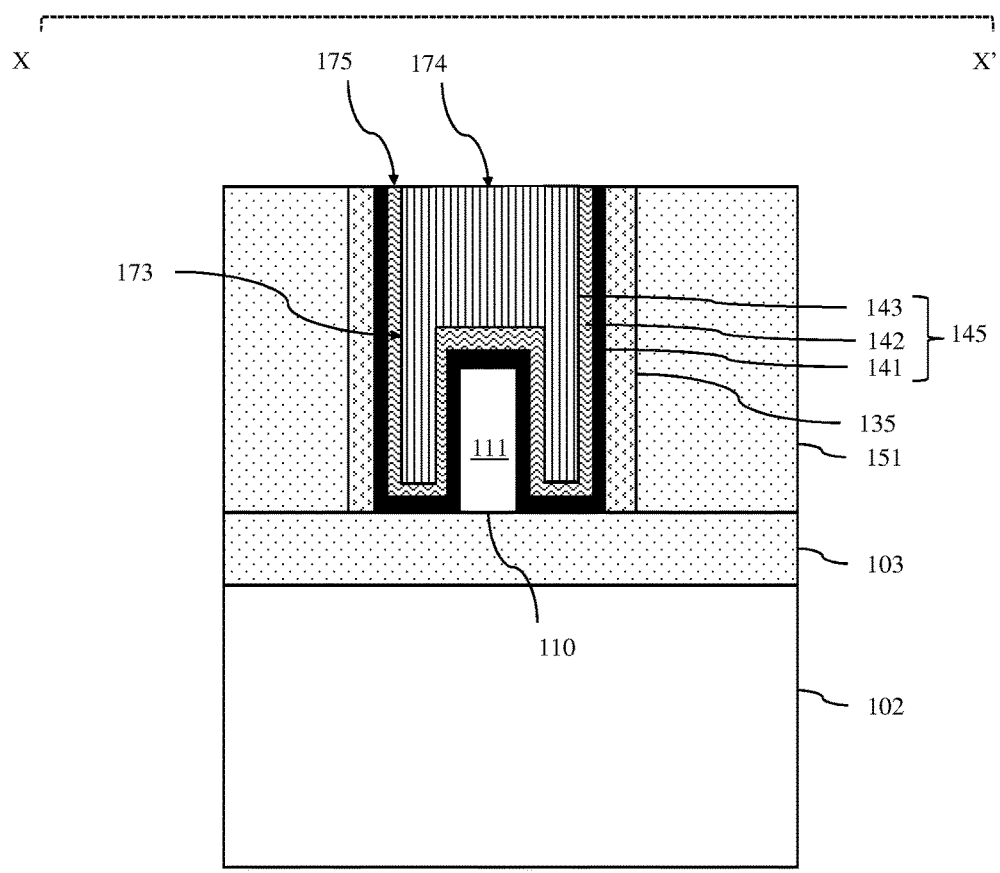

Once the top surfaces of the sacrificial gate 130 and the gate sidewall spacer 135 are exposed, the sacrificial gate 130 can be selectively removed (216, see FIG. 7). Specifically, the sacrificial material of the sacrificial gate 130 can be selectively etched over the dielectric materials used for the gate sidewall spacer 135 and the ILD layer 151, thereby creating a gate opening 136 in the ILD layer 151. The gate opening will have sidewalls lined with the gate sidewall spacer 135.

A replacement metal gate 145 with a dielectric gate cap 148 can then be formed in the gate opening 136 (218-228, see FIGS. 8A-10).

To form the replacement metal gate, a gate dielectric layer 141 can be conformally deposited so as to line the gate opening 136 (218). For example, in the case of a FINFET, the gate dielectric layer 141 will be conformally deposited so as to have vertical and horizontal portions, as illustrated. The vertical portions can be immediately adjacent to the opposing sides of the semiconductor body 110 at the channel region 111 and also immediately adjacent to the gate sidewall spacer 135. The horizontal portions can be above the top surface of the semiconductor body 110 at the channel region 111 and also on the insulator layer 103 between the semiconductor body 110 and the gate sidewall spacer 135. The conformal gate dielectric layer 141 can be a silicon dioxide gate dielectric layer. Alternatively and preferably, the conformal gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Techniques for conformally depositing such gate dielectric materials are well known in the art and, thus, the details have been omitted from this specification in order to allow the reader to focus on the salient aspects of the disclosed methods.

Next, a stack of gate conductor layers can be formed on the gate dielectric layer 141. The stack of gate dielectric layers can include, for example, at least one conformal work function metal layer 142 and a conductive fill material layer 143 on the conformal work function metal layer(s) 142.

Specifically, at least one work function metal layer 142 can be conformally deposited over the conformal gate dielectric layer 141 (220). For example, in the case of a FINFET, the work function metal layer(s) 142 can be deposited onto the conformal gate dielectric layer 141 so as to also have vertical portions and horizontal portions. The vertical portions can be positioned laterally immediately adjacent to the vertical portions of the conformal gate dielectric layer 141 opposite the semiconductor body 110 and the gate sidewall spacer 135, respectively. The horizontal portions can be above and immediately adjacent to the horizontal portions of the conformal gate dielectric layer 141 opposite the top surface of the semiconductor body 110 and the insulator layer 103, respectively. It should be noted that the metal material or metal alloy material of the conformal work function metal layer 142 can be preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

A conductive fill material layer 143 can be deposited so as to fill any remaining space in the gate opening 136 (222). For example, at process 222, a blanket layer of a metal or a metal alloy, such as tungsten, a tungsten alloy (e.g., tungsten silicide or titanium tungsten), cobalt, aluminum or any other suitable metal or metal alloy, can be deposited. Alternatively, a blanket layer of doped polysilicon can be deposited. Next, a polishing process (e.g., a CMP process) can be performed in order to remove the materials of the conformal gate dielectric layer 141, the conformal work function metal layer(s) 142 and the conductive fill material layer 143 from above the top surface of the ILD layer 151 (224, see FIGS. 8A-8B). Such a polishing process will ensure that the top 175 of a vertical portion of the conformal work metal layer 142 that is positioned laterally immediately adjacent to and between a vertical portion of the gate dielectric layer 141 and an outer sidewall 173 of the conductive fill material layer 143 is approximately level with the top surface 174 of the conductive fill material layer 143.

Figure 9A:
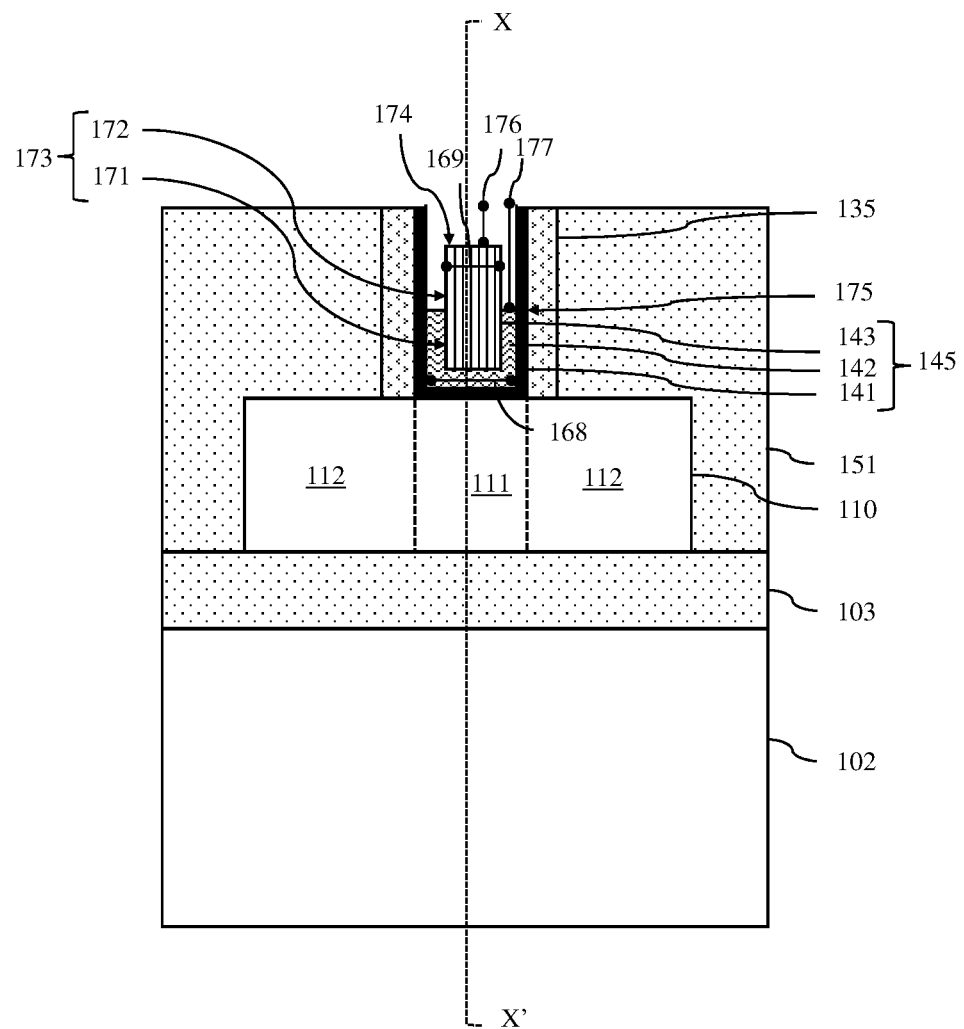
FIGS. 9A and 9B are different cross section diagrams illustrating a partially completed FET formed according to the flow diagram of FIG. 2.
Figure 9B:
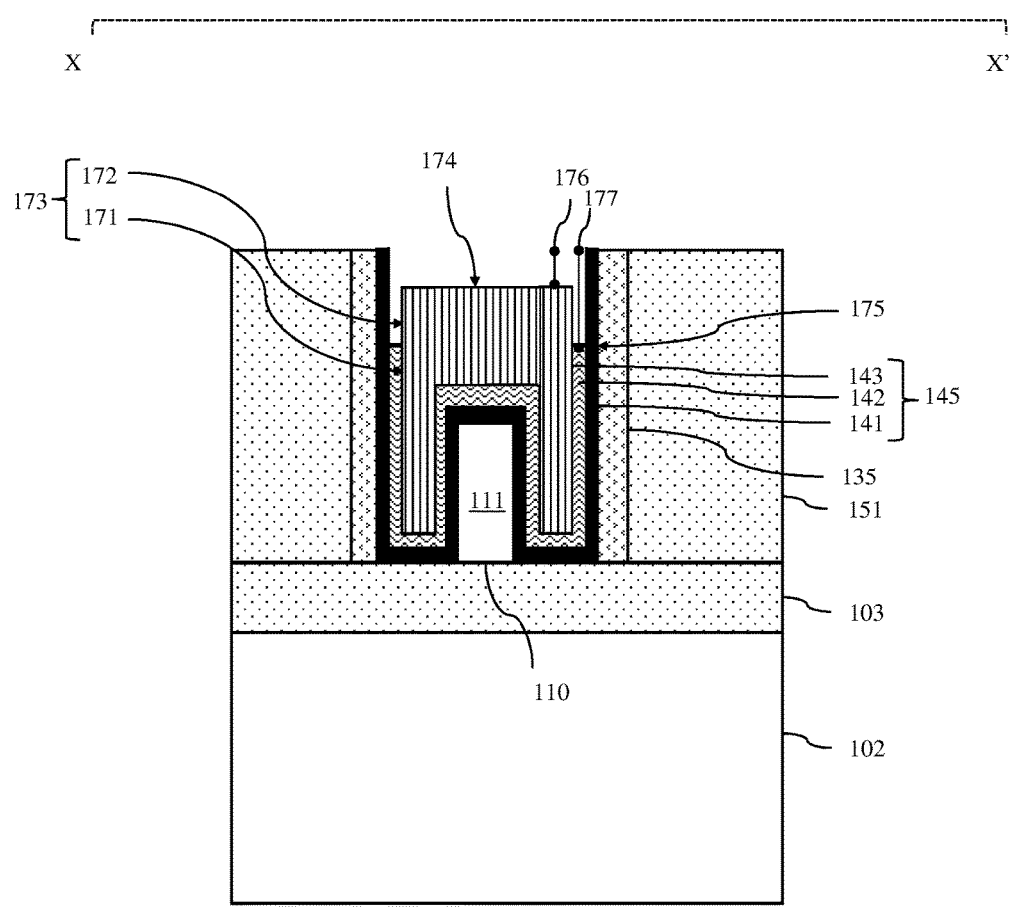

At least one etch process can be performed in order to etch back the top surface 174 of the conductive fill material layer 143 to a first depth 176 and to further etch back the top 175 of the adjacent vertical portion of the conformal work function metal layer 142 to a second depth 177 that is greater than the first depth 176 (226, see FIGS. 9A-9B). The second depth 177 can be at least 1.25 times greater than the first depth 176 (e.g., 1.5 times greater, 2 times greater, etc.). As a result of the etch process(es), an upper portion 172 of the outer sidewall 173 of the conductive fill material layer 143 will be exposed but a lower portion 171 of that outer sidewall 173 will remain covered by the conformal work function metal layer 142. Furthermore, as a result of the etch processes, the stack of gate conductor layers within the resulting replacement metal gate 145 will have a lower section with a first width 168, as measured near the semiconductor body 110, and an upper section with a second width 169, as measured above the top 175 of the conformal work function metal layer 142, and the second width 169 will be narrower than the first width 168 (see FIG. 9A).

In one embodiment, one selective anisotropic etch process can be performed to selectively etch back (i.e., recess) the top surface 174 of the conductive fill material layer 143 to the first depth 176 (without significantly etching the ILD layer 151, the gate sidewall spacer 135 or conductive work function metal layer 142). Before or after etching of the conductive fill material layer 143, a separate selective anisotropic etch process can be performed to selectively etch back (i.e., recess) the top 175 of the conformal work function metal layer 142 to the second depth 177 (without significantly etching the ILD layer 151, the gate sidewall spacer 135 or the conductive fill material layer 143).

In another embodiment, a single etch process can be performed in order to essentially simultaneously etch back the top surface 174 of the conductive fill material layer 143 to the first depth 176 and the top 175 of the adjacent vertical portion of the conformal work function metal layer 142 to the second depth 177. In this case, the etchants used during the single etch process can be preselected so that the conformal work function metal layer 142 is etched at a faster rate than the conductive fill material layer 143, thereby achieving the different depths. For example, if the conformal work function metal layer 142 is a titanium nitride layer and the conductive fill material layer 143 is tungsten, tungsten silicide or titanium tungsten, a plasma dry etch process can be performed using a combination of chlorine and fluorine-based gases (e.g., chlorine gas, nitrogen trifluoride gas, fluoroform gas, and/or sulfer hexafluoride gas). The chlorine and fluorine-based gases react with tungsten and titanium nitride at different rates, performing different volatile etch by-products and, thereby achieving the different etch depths in the different layers. It should be noted that the addition of a chlorine-based inhibitor gas (e.g., boron trichloride or silicon tetrachloride) during this single etch process will provide an anisotropic etch profile, thereby protecting the exposed upper portion 172 of the outer sidewall 173 of the conductive fill material layer 143. During such a single etch process, process parameters can include, but are not limited to, a relatively high electrostatic chuck temperature range of 80-120° C., a pressure range of 0 to 10 mTorr, an inductively coupled plasma (ICP) radio frequency (RF) power range of 500 to 2000 Watts with zero bias RF power to ensure the high selective chemical etching.

Figure 10:
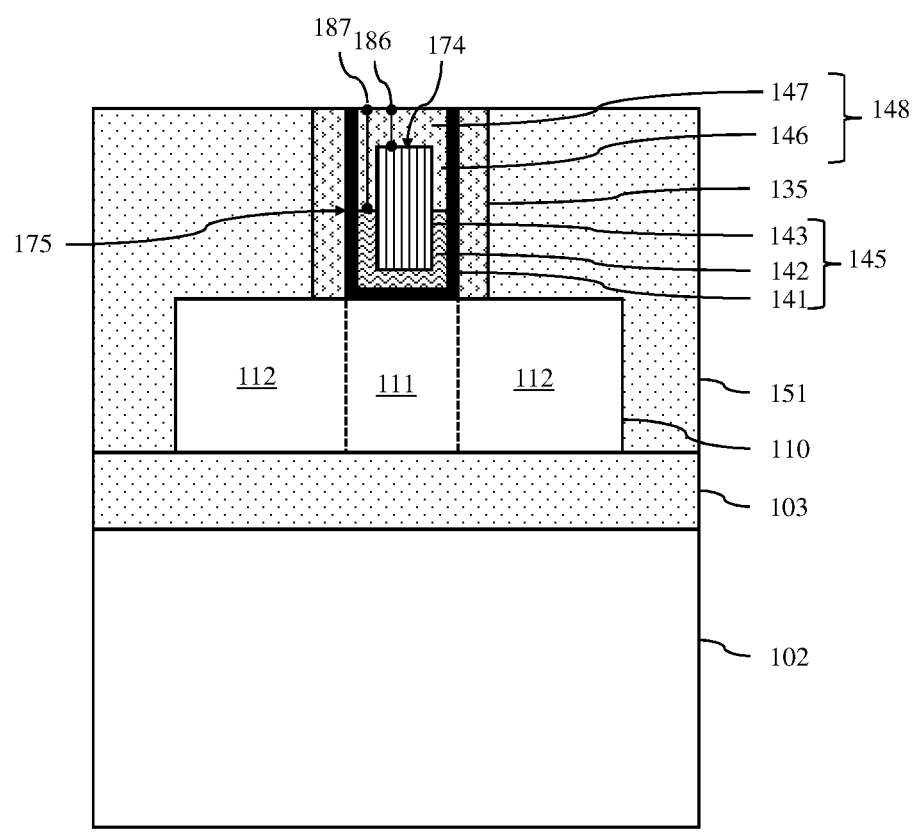
FIG. 10 is a cross section diagram illustrating a partially completed FET formed according to the flow diagram of FIG. 2.

Subsequently, a dielectric gate cap 148 can be formed on the replacement metal gate 145 (228, see FIG. 10). For example, a dielectric gate cap layer can be deposited onto the ILD layer 151 and into the recess created by process 226 such that the recess is completely filled. The dielectric gate cap layer can, for example, be a layer of silicon nitride, silicon carbon nitride, silicon boron carbon nitride, silicon oxycarbide, or some other suitable gate cap material. A polishing process (e.g., a CMP process) can then be performed in order to remove the material of the dielectric gate cap layer from above the top surface of the ILD layer 151. As a result of the shape of the recess, the gap cap 148 will have a center portion 147 and an edge portion 146. The center portion 147 will be above and immediately adjacent to the top surface 174 of the conductive fill material layer 143. The edge portion 146 can laterally surround the center portion 147, can be above and immediately adjacent to the top 175 of the adjacent vertical portion of the conformal work function metal layer 142 and can further be positioned laterally immediately adjacent to the upper portion 172 of the outer sidewall 173 of the conductive fill material layer 143. As a result of the shape of the recess and, particularly, the different depths of the top surface 174 of the conductive fill material layer 143 and the top 175 of the conformal work function metal layer 142, the center portion 147 of the dielectric gate cap 148 will have a first thickness 186 (as measured from the top of the dielectric gate cap 148 to the top surface 174 of the conductive fill material layer 142), the edge portion 146 will have a second thickness 187 (as measured from the top of the dielectric gate cap 148 to the top 175 of the adjacent vertical portion of the conformal metal layer 142) and the second thickness of the edge portion 146 will be at least 1.25 times greater than the first thickness of the center portion 147 (e.g., 1.5 times greater, 2 times greater, etc.).

It should be noted that the etch process(es) performed at process 226 can be selective over the material of the gate dielectric layer 141 so that the gate dielectric layer 141 remains essentially intact, as illustrated, such that the gate dielectric layer 141 laterally surrounds and is immediately adjacent to the dielectric gate cap 148 formed at process 228. Alternatively, the gate dielectric layer 141 may also be etched back to some degree at process 226 such that at least the uppermost portion of the dielectric gate cap 148 is laterally surrounded by and immediately adjacent to the gate sidewall spacer 135.

Figure 11:
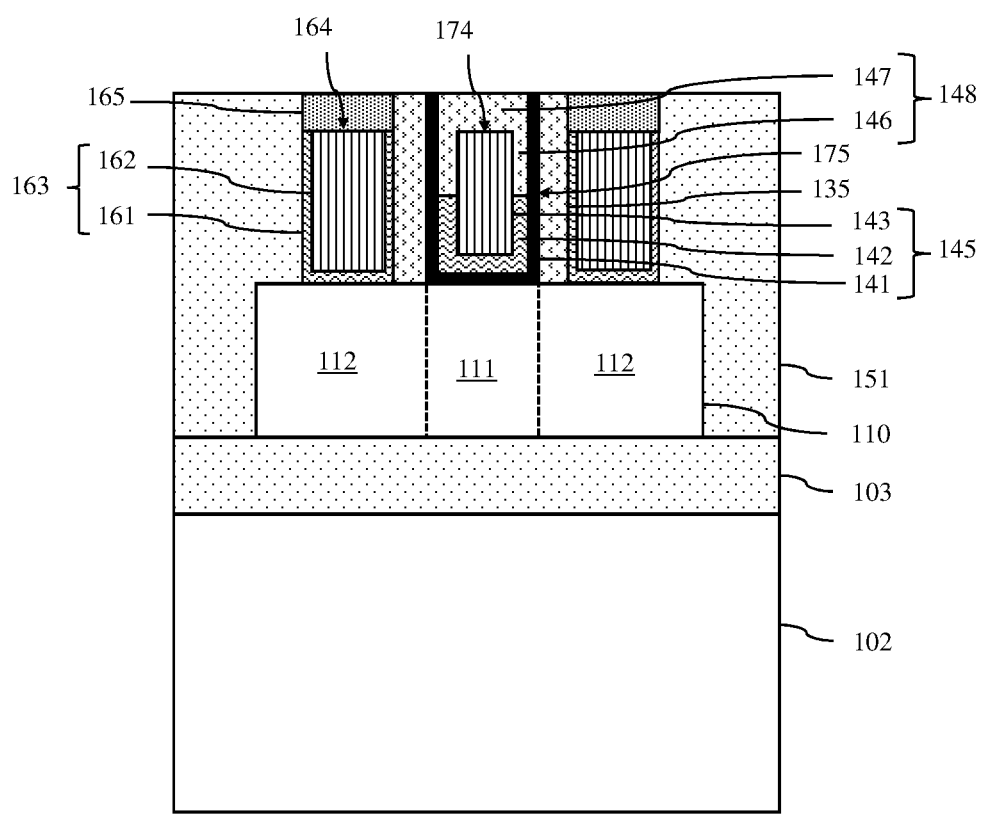
FIG. 11 is a cross section diagram illustrating a partially completed FET formed according to the flow diagram of FIG. 2.

Subsequently, metal plugs 163 with dielectric plug caps 165 can be form in the ILD layer 151 on the source/drain regions 112 (or on the epitaxial source/drain regions, if present), respectively (230, see FIG. 11). For example, plug opening can be formed (e.g., lithographically patterned and etched) such that they extend essentially vertically through the ILD layer 151 to the source/drain regions 112. One or more conformal layers 161 such as a conformal adhesive layer (e.g., a titanium adhesive layer or other suitable adhesive layer) and/or a conformal barrier layer (e.g., titanium nitride barrier layer or other suitable barrier layer) can be deposited so as to line the plug openings. Then, a conductor 162 and, particularly, a metal or metal alloy (e.g., a tungsten, cobalt, aluminum or any other suitable metal plug material) can be deposited so as to fill the remaining spaces within the openings. A polishing process (e.g., a CMP process) can be performed to remove the metal plug materials from above the top surface of the ILD layer 151 and an etch process can be performed in order to recess the metal plugs 163 within the plug openings. It should be noted that this etch process should be performed such that the top surfaces 164 of the metal plugs 163 are above the level of the top 175 of the conformal work function metal layer 142 in the replacement metal gate 145. For example, this etch process can be performed such that the top surfaces 164 of the metal plugs 163 are approximately co-planar with the top surface 174 of the conductive fill material layer 143 in the replacement metal gate 145. Next, a dielectric plug cap layer can be deposited onto the ILD layer 151 and into the recesses above the metal plugs 163 and another polishing process (e.g., another CMP process) can be performed to remove the material of the dielectric plug cap layer from above the top surface of the ILD layer 151, thereby forming the dielectric plug caps 165 on the metal plugs 163. It should be noted that the dielectric plug cap layer could be made of the same dielectric material as the dielectric gate cap layer. Alternatively, the dielectric plug cap layer and the dielectric gate cap layer may be made of different dielectric materials.

Figure 12:
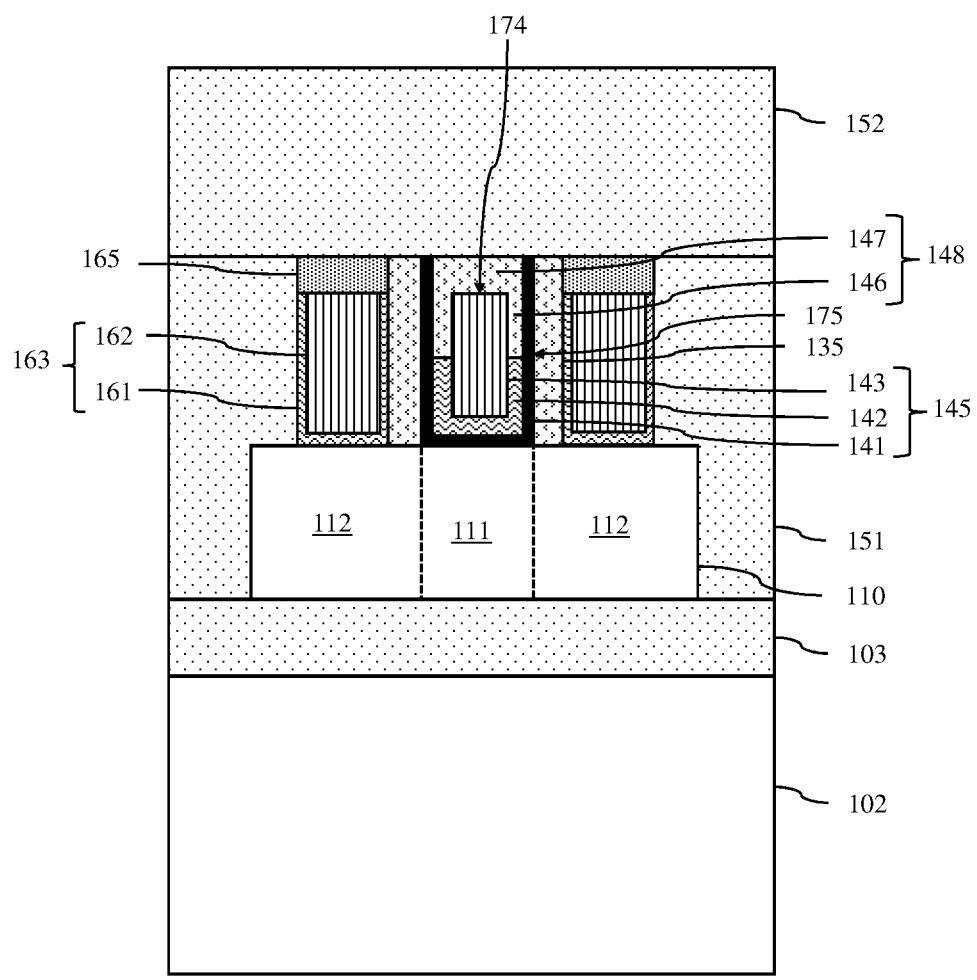
FIG. 12 is a cross section diagram illustrating a partially completed FET formed according to the flow diagram of FIG. 2.

An additional ILD layer 152 can be deposited above and immediately adjacent to the ILD layer 151, the dielectric plug caps 165, the gate sidewall spacer 135 and the dielectric gate cap 148 (232, see FIG. 12). The additional ILD layer 152 can be made of the same ILD material as the ILD layer 152 or a different ILD material. Exemplary ILD materials include, but are not limited to, silicon dioxide, borophosphosilicate glass (BPSG), tetraethyl orthosilicate (TEOS), and fluorinated tetraethyl orthosilicate (FTEOS).

Figure 13:
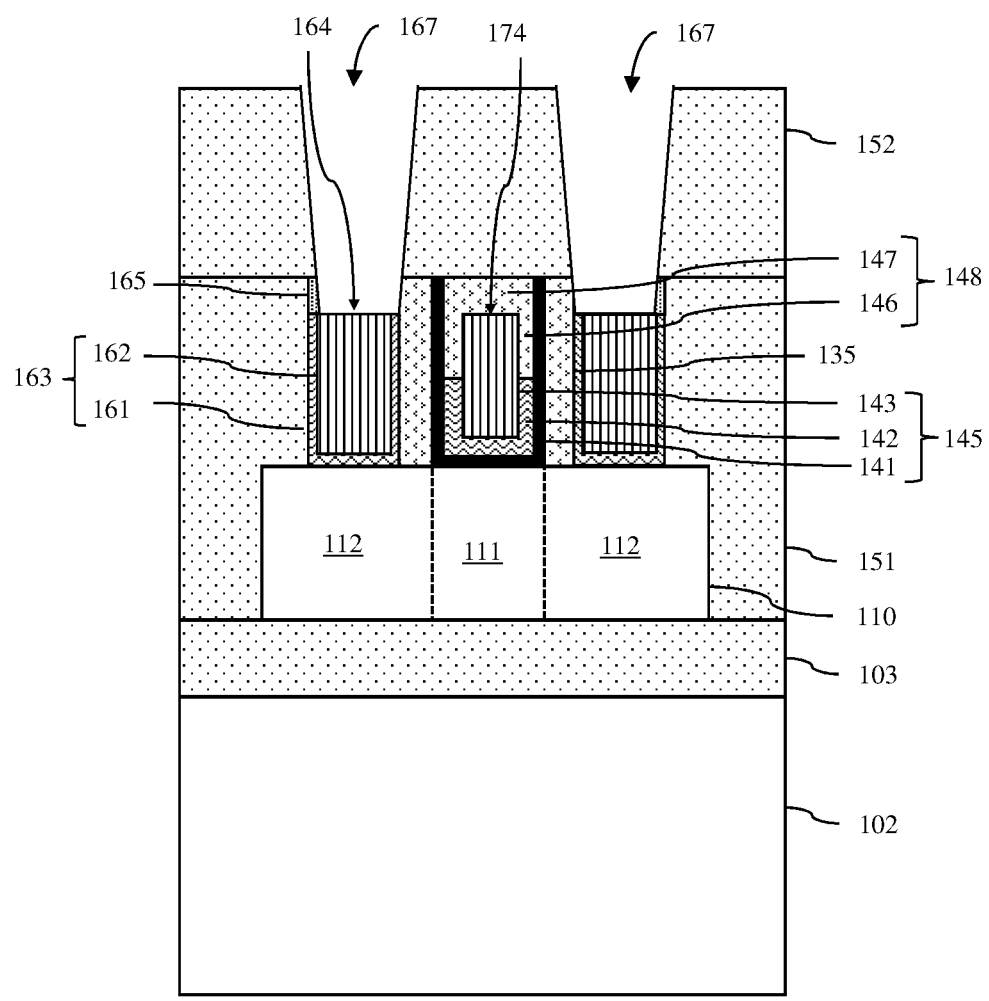
FIG. 13 is a cross section diagram illustrating a partially completed FET formed according to the flow diagram of FIG. 2.

Contacts can be formed through the additional ILD layer 152 to the metal plugs 163 and replacement metal gate 145 (234). For example, source/drain contact openings 167 can be formed (e.g., lithographically patterned and etched) such that they extend essentially vertically through the additional ILD layer 152 and through the dielectric plug caps 165 to the top surfaces 164 of the metal plugs 163 (see FIG. 13). A gate contact opening (not shown) can similarly be formed (e.g., lithographically patterned and etched) so as to extend essentially vertically through the additional ILD layer 152 and through the dielectric gate cap 148 to the top surface 174 of the conductive fill material layer 143 of the replacement metal gate 145. At least one metal layer can then be deposited to fill the source/drain contact openings 167 and the gate contact opening, thereby forming source/drain contacts 166 (see FIG. 1A) and a gate contacts (not shown), respectively. The metal deposited to form the contacts at process 234 can be, for example, copper, tungsten, aluminum, cobalt, or any other metal material that is suitable for MOL contact formation. Techniques for depositing various metal materials to fill contact openings are well known in the art and, thus, the techniques are omitted from this specification in order to allow the reader to focus on the salient aspects of the disclosed methods. Following metal deposition, a polishing process (e.g., a CMP process) can be performed to remove metal from above the additional ILD layer 152. As a result of the method processes described above, each source/drain contact 155 will be physically separated from the conductive fill material layer 143 of the gate 145 by at least a first distance 181 and from the conformal metal layer 142 by at least a second distance 182 that is equal to or greater than the first distance 181.

In the embodiments of the FET structure and method described above, the FET 100 can be an N-type FET or a P-type FET. For an N-type FET, the first type conductivity of the channel region within the semiconductor body 110 can be a P-type conductivity and the second type conductivity of the source/drain regions can be an N-type conductivity; whereas, for a P-type FET, the first type conductivity of the channel region 111 within the semiconductor body 110 can be an N-type conductivity and the second type conductivity of the source/drain regions can be a P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A field effect transistor comprising:
   a gate adjacent to a semiconductor body at a channel region and comprising:
      a conformal dielectric layer immediately adjacent to the semiconductor body; and,
      a stack of gate conductor layers comprising:
         a conformal metal layer on the conformal dielectric layer; and
         a conductive fill material layer on the conformal metal layer, wherein the conductive fill material layer has a top surface and an outer sidewall, the outer sidewall has a lower portion and an upper portion above the lower portion, and the conformal metal layer has an essentially vertical portion positioned laterally immediately adjacent to the lower portion of the outer sidewall; and
   a gate cap having a center portion and an edge portion, wherein the center portion is above and immediately adjacent to the top surface and the edge portion is positioned laterally immediately adjacent to the upper portion of the outer sidewall and is further above and immediately adjacent to a top of the vertical portion of the conformal metal layer.

2. The field effect transistor of claim 1, wherein the center portion has a first thickness and the edge portion has a second thickness that is at least 1.25 times greater than the first thickness.

3. The field effect transistor of claim 1, wherein the conductive fill material layer comprises any of tungsten, a tungsten alloy, aluminum, cobalt and doped polysilicon.

4. The field effect transistor of claim 1, wherein the stack has a first width adjacent to the semiconductor body and a second width adjacent to the gate cap and wherein the second width is narrower than the first width.

5. The field effect transistor of claim 1, wherein the semiconductor body further comprises source/drain regions, the channel region is positioned laterally between the source/drain regions and the field effect transistor further comprises:
   an interlayer dielectric layer above the source/drain regions;
   at least one metal plug with a plug cap extending essentially vertically through the interlayer dielectric layer to at least one source/drain region of the source/drain regions;
   an additional interlayer dielectric layer on the interlayer dielectric layer and extending over the gate cap and the plug cap; and
   a source/drain contact extending essentially vertically through the additional interlayer dielectric layer and the plug cap such that a bottom surface of the source/drain contact is above and immediately adjacent to the metal plug and further above a level of the top of the vertical portion of the conformal metal layer.

6. The field effect transistor of claim 5, wherein the source/drain contact and the conductive fill material layer of the gate are separated by a first distance and the source/drain contact and the conformal metal layer of the gate are separated by a second distance that is equal to or greater than the first distance.

7. The field effect transistor of claim 5, wherein the bottom surface of the source/drain contact and the top surface of the conductive fill material layer are approximately level.

* * * * *